US009438280B2

(12) United States Patent
Yukizaki et al.

(10) Patent No.: US 9,438,280 B2
(45) Date of Patent: Sep. 6, 2016

(54) IN-VEHICLE COMMUNICATION APPARATUS

(71) Applicant: DENSO CORPORATION, Kariya, Aichi-pref. (JP)

(72) Inventors: Yasumune Yukizaki, Kariya (JP); Tadao Suzuki, Kariya (JP); Yuji Sugimoto, Nishio (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/898,713

(22) PCT Filed: May 22, 2014

(86) PCT No.: PCT/JP2014/002681
§ 371 (c)(1),
(2) Date: Dec. 15, 2015

(87) PCT Pub. No.: WO2014/203452
PCT Pub. Date: Dec. 24, 2014

(65) Prior Publication Data
US 2016/0142079 A1    May 19, 2016

(30) Foreign Application Priority Data

Jun. 18, 2013    (JP) .................................. 2013-127821

(51) Int. Cl.
*H04B 7/00* (2006.01)
*H04B 1/04* (2006.01)
(Continued)

(52) U.S. Cl.
CPC .......... *H04B 1/0458* (2013.01); *H03F 1/0205* (2013.01); *H03F 3/19* (2013.01);
(Continued)

(58) Field of Classification Search
CPC ...... H03F 1/0205; H03F 3/19; H04W 52/04; H04B 1/02

USPC .......... 455/522, 569.2, 575.9, 91, 99, 127.1, 455/129
See application file for complete search history.

(56) References Cited

U.S. PATENT DOCUMENTS

| | | | | |
|---|---|---|---|---|
| 5,193,219 A | * | 3/1993 | Tamura | H04B 1/3877 455/115.1 |
| 5,303,395 A | * | 4/1994 | Dayani | H03G 3/3042 455/127.3 |
| 5,995,813 A | * | 11/1999 | Ishikura | H04W 52/52 455/127.2 |

FOREIGN PATENT DOCUMENTS

| | | |
|---|---|---|
| JP | H10290129 A2 | 10/1998 |
| JP | H10341117 A | 12/1998 |

(Continued)

OTHER PUBLICATIONS

International Search Report and Written Opinion (in Japanese with English Translation) for PCT/JP2014/002681, mailed Aug. 19, 2014; ISA/JP.

*Primary Examiner* — Tuan Pham
(74) *Attorney, Agent, or Firm* — Harness, Dickey & Pierce, P.L.C.

(57) ABSTRACT

An in-vehicle communication apparatus includes an antenna module, and a wireless communication device physically separated from the antenna module and connected to the antenna module through a coaxial cable. The antenna module includes an antenna, and a transmission amplifier of the antenna. The wireless communication device includes a power generation portion that supplies a power driving the antenna module, a signal generation portion that generates a transmission signal, a power superimposition portion that superimposes the transmission signal on the power supplied from the power generation portion, and transmits a superimposed power to the transmission amplifier, a current detection portion that detects a consumption current value from the power, a correspondence relationship hold portion that holds a correspondence relationship between the consumption current value and an output power value, and a regulation portion that adjusts the transmission signal to maintain the output power value at a predetermined power value.

8 Claims, 4 Drawing Sheets

(51) Int. Cl.
- *H03F 3/195* (2006.01)
- *H03F 3/24* (2006.01)
- *H04B 1/3877* (2015.01)
- *H03F 1/02* (2006.01)
- *H03F 3/19* (2006.01)
- *H04L 29/08* (2006.01)

(52) U.S. Cl.
CPC ............... *H03F 3/195* (2013.01); *H03F 3/24* (2013.01); *H03F 3/245* (2013.01); *H04B 1/3877* (2013.01); *H04L 67/12* (2013.01); *H03F 2200/451* (2013.01); *H04B 2001/0416* (2013.01)

(56) References Cited

FOREIGN PATENT DOCUMENTS

| | | |
|---|---|---|
| JP | 2003243995 A | 8/2003 |
| JP | 2003309474 A | 10/2003 |
| JP | 2004072556 A | 3/2004 |
| JP | 2006165985 A | 6/2006 |
| JP | 2008236558 A | 10/2008 |
| JP | 2011035541 A | 2/2011 |
| JP | 2011228774 A | 11/2011 |
| JP | 2011234112 A | 11/2011 |

* cited by examiner

| CONSUMPTION CURRENT VALUE (mA) | OUTPUT POWER VALUE (dBm) |
|---|---|
| 300 | 17 |
| 350 | 18 |
| 400 | 19 |
| 450 | 20 |
| 500 | 21 |
| 550 | 22 |

IN-VEHICLE COMMUNICATION APPARATUS

CROSS-REFERENCE TO RELATED APPLICATIONS

This application is a U.S. National Phase Application under 35 U.S.C. 371 of International Application No. PCT/JP2014/002681 filed on May 22, 2014 and published in Japanese as WO 2014/203452 A1 on Dec. 24, 2014. This application is based on and claims the benefit of priority from Japanese Patent Application No. 2013-127821 filed on Jun. 18, 2013. The entire disclosures of all of the above applications are incorporated herein by reference.

TECHNICAL FIELD

The present disclosure relates to an in-vehicle communication apparatus in which an antenna module is connected with a wireless communication device through a coaxial cable.

BACKGROUND ART

Conventionally, as disclosed in patent document 1, an in-vehicle communication apparatus is known in which an antenna located at a physically remote place is connected to a wireless communication device that performs a wireless communication through the antenna with a coaxial cable. When a transmission amplifier of the antenna is physically separated from a wireless communication device that supplies a driving power of the transmission amplifier through the coaxial cable, a transmission output of the antenna is affected by a loss of the coaxial cable.

The inventors of the present application have found the following regarding an in-vehicle communication apparatus. As a method of regulating the transmission output of the antenna taking an effect of the loss of the coaxial cable into account, a technique may be considered in which a result of detecting an output signal of the transmission amplifier by a detector is output to the wireless communication device and, based on the detection result, a power supplied to the transmission amplifier is regulated in the wireless communication device so as to obtain a predetermined transmission output.

When the detector is used in an in-vehicle communication apparatus in which an antenna module and a wireless communication device, which are located at places physically separated from each other, are connected through a coaxial cable, costs such as a financial loss, an labor may increase. Incidentally, the antenna module includes the antenna and the transmission amplifier.

When it is necessary to regulate the transmission output of the antenna in the in-vehicle communication apparatus after mounted to a vehicle, not only the detector but also a dedicated vehicle harness that feeds back the detection result from the detector to the wireless communication device may be required to be mounted to the vehicle. This may cause an increase in the financial loss or the labor. In addition, a method of correcting the transmission output of the antenna may be prepared for each vehicle or each vehicle model. Thus, in this case, the financial loss or the labor may increase.

PRIOR ART DOCUMENT

Patent Document

Patent document 1: JP 2008-236558 A

SUMMARY OF THE INVENTION

It is an object of the present disclosure to provide an in-vehicle communication apparatus in which an antenna module and a wireless communication device, which are physically separated from each other, are connected to each other through a coaxial cable. A transmission output of an antenna can be maintained at a predetermined output while the costs such as a financial loss, a labor are suppressed.

According to one example of the present disclosure, an in-vehicle communication apparatus includes an antenna module, and a wireless communication device that is physically separated from the antenna module and connected to the antenna module through a coaxial cable. The antenna module includes an antenna, and a transmission amplifier of the antenna. The wireless communication device includes a power generation portion that supplies a power driving the antenna module, a signal generation portion that generates a transmission signal to be transmitted from the antenna, a power superimposition portion that superimposes the transmission signal generated by the signal generation portion on the power supplied from the power generation portion, and transmits the superimposed power to the transmission amplifier through the coaxial cable, a current detection portion that detects a consumption current value of the transmission amplifier from the power that is supplied from the power generation portion to the transmission amplifier, a correspondence relationship hold portion that holds a correspondence relationship between the consumption current value of the transmission amplifier and an output power value of the transmission amplifier in advance, and a regulation portion that adjusts the transmission signal generated by the signal generation portion to maintain the output power value of the transmission amplifier obtained with reference to the correspondence relationship held in the correspondence relationship hold portion based on the consumption current value of the transmission amplifier detected by the current detection portion at a predetermined power value.

According to the present disclosure, in the in-vehicle communication apparatus in which the antenna module and the wireless communication device, which are physically separated from each other, are connected to each other through the coaxial cable, it may be possible maintain the transmission output of the antenna at the predetermined output while the costs such as the financial loss or the labor are suppressed.

BRIEF DESCRIPTION OF THE DRAWINGS

The above and other objects, features, and advantages of the present disclosure will become more apparent from the following detailed description with reference to the accompanying drawings, in the drawings.

PREFERRED EMBODIMENTS FOR CARRYING OUT THE INVENTION

Embodiments of the present disclosure will be described with reference to the drawings.

First Embodiment

Overall Configuration

Figure 1:
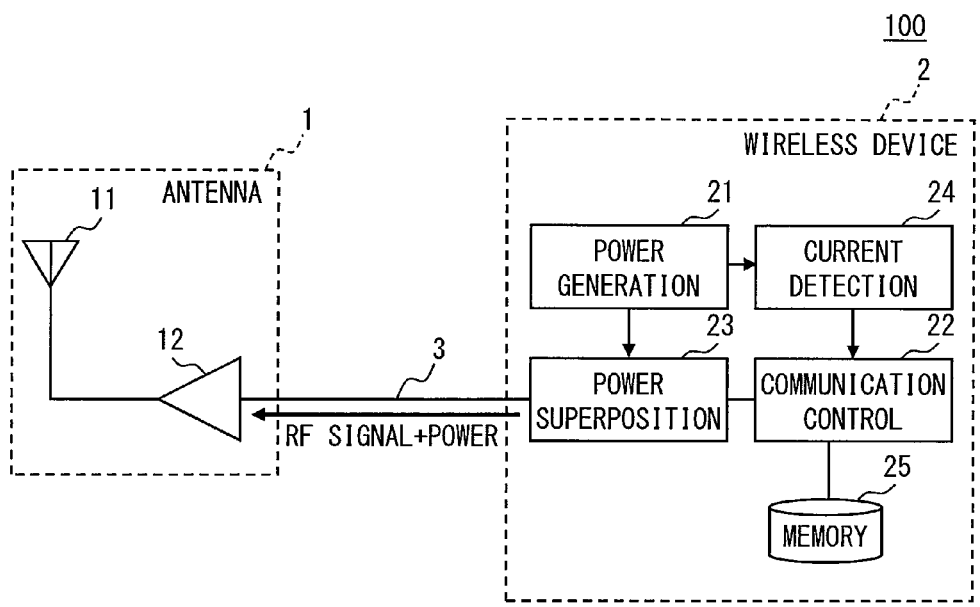
FIG. 1 is a block diagram illustrating an example of a schematic configuration of an in-vehicle communication apparatus.

FIG. 1 is a block diagram illustrating an example of a schematic configuration of an in-vehicle communication apparatus 100 to which the present disclosure is applied. The in-vehicle communication apparatus 100 illustrated in FIG. 1 is mounted to a vehicle. The in-vehicle communication apparatus 100 includes an antenna module 1 and a wireless communication device 2 that are connected to each other through a coaxial cable 3.

The in-vehicle communication apparatus 100 performs, for example, both or any one of a vehicle-to-vehicle communication and a road-to-vehicle communication. Communication frequencies of the vehicle-to-vehicle communication and the road-to-vehicle communication are, for example, a 700 MHz band or a 5.9 GHz band.

The antenna module 1 is installed, for example, on an outer surface of a vehicle roof. By contrast, the wireless communication device 2 is installed at a predetermined position inside of the vehicle. The position at which the wireless communication device 2 is installed is not particularly limited as long as the position is inside of the vehicle, but since the wireless communication device 2 includes electronic components, an environment where a temperature change caused by sunlight is smaller is preferable.

(Configuration of Antenna Module 1)

As illustrated in FIG. 1, the antenna module 1 includes an antenna 11 and a transmission amplifier 12. The antenna 11 is an antenna used for transmission of a signal, and connected to the wireless communication device 2 through the transmission amplifier 12 and the coaxial cable 3. In the present embodiment, an example in which an RF (radio frequency) signal is used as a signal will be described below.

The transmission amplifier 12 is a known amplifier, and amplifies the RF signal transmitted from the wireless communication device 2 through the coaxial cable 3. The transmission amplifier 12 receives the driving power supply from the wireless communication device 2 through the coaxial cable 3.

(Configuration of Wireless Communication Device 2)

As illustrated in FIG. 1, the wireless communication device 2 includes a power generation portion 21, a communication control portion 22, a power superimposition portion 23, a current detection portion 24, and a memory 25. The power generation portion 21 generates a power (that is, electric power) that is supplied to the antenna module 1. The power generation portion 21 corresponds to a power generation portion in the present disclosure. In detail, the power generation portion 21 supplies a driving power to the transmission amplifier 12.

Figure 2:
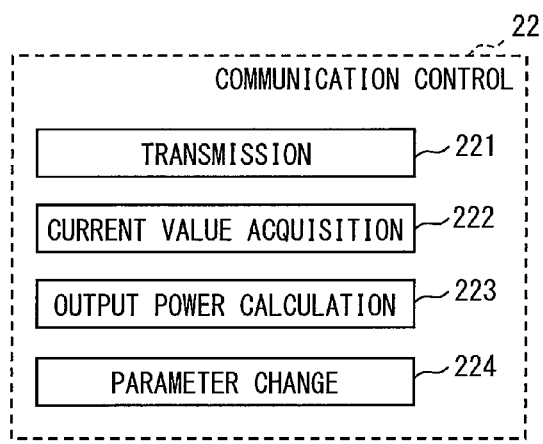
FIG. 2 is a block diagram illustrating an example of a schematic configuration of a communication control portion in a wireless communication device.

The communication control portion 22 performs various processes based on various pieces of information input from the current detection portion 24. As illustrated in FIG. 2, the communication control portion 22 includes, as functional blocks, a transmission processing portion 221, a consumption current value acquisition portion 222, an amplifier output power calculation portion 223, and a parameter change portion 224. The transmission processing portion 221 generates and transmits the RF signal. The transmission processing portion 221 corresponds to a signal generation portion in the present disclosure. The consumption current value acquisition portion 222, the amplifier output power calculation portion 223, and the parameter change portion 224 will be described in detail later.

The power superimposition portion 23 superimposes the power supplied from the power generation portion 21 on the RF signal transmitted from the transmission processing portion 221 of the communication control portion 22, and transmits the superimposed power to the transmission amplifier 12 through the coaxial cable 3.

The current detection portion 24 detects the consumption current value of the transmission amplifier 12 from the power supplied from the power generation portion 21 to the transmission amplifier 12. Since the power for driving the transmission amplifier 12 is supplied from the power generation portion 21, the consumed current of the transmission amplifier 12 can be grasped by the current detection portion 24 on a side of the wireless communication device 2.

Figures 3, 4:
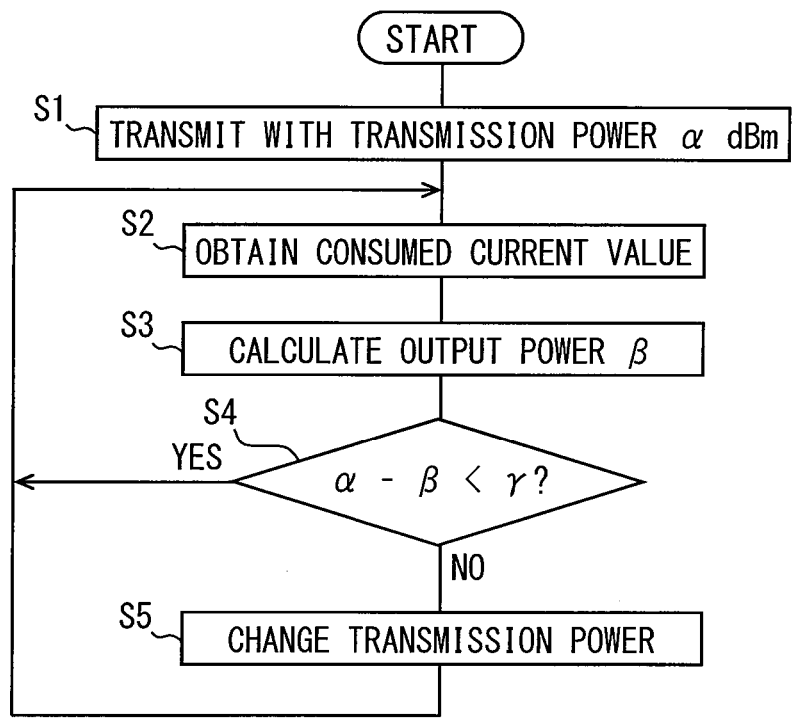
FIG. 3 is a schematic view illustrating an example of a correspondence relationship table.
FIG. 4 is a flowchart illustrating an example of processing related to a transmission power control in the communication control section.

The memory 25 holds a correspondence relationship between the consumption current value of the transmission amplifier 12 and the output power value of the transmission amplifier 12 in advance. The memory 25 corresponds to a correspondence relationship hold portion in the present disclosure. As an example, the memory 25 holds a table associating the consumption current value of the transmission amplifier 12 with the output power value of the transmission amplifier 12 (hereinafter referred to as a correspondence relationship table) illustrated in FIG. 3 in advance. The correspondence relationship table may be obtained by, for example, performing measurement in advance. In the present embodiment, an example in which the correspondence relationship table illustrated in FIG. 3 is used will be described below.

The present embodiment shows the configuration having the transmission amplifier 12 in the antenna module 1. Alternatively, the transmission amplifier 12 may be provided in the antenna module 1, and another transmission amplifier may be provided between the communication control portion 22 and the power superimposition portion 23 in the wireless communication device 2.

(Processing Involved in Transmission Power Control of Communication Control Portion 22)

A description will be given of processing involved in the transmission power control in the communication control portion 22 of the wireless communication device 2 with reference to a flowchart of FIG. 4. A flowchart of FIG. 4 may start when, for example, the wireless communication device 2 starts, and end when the start of the wireless communication device 2 ends.

In S1, the transmission processing portion 221 starts the transmission of the RF signal by a predetermined transmission power value α dBm, and proceeds to S2. Symbol α represents an initial transmission power value, and may be set to maintain the transmission output of the antenna at a predetermined output, for example, without considering a cable transmission loss of the coaxial cable 3. In an example of the present embodiment, it is assumed that α is 20 dBm. The transmitted RF signal is superimposed on the power as described above, and transmitted to the transmission amplifier 12 through the coaxial cable 3.

In S2, the consumption current value acquisition portion 222 obtains the consumption current value of the transmission amplifier 12, which is detected by the current detection portion 24, and proceeds to S3. As an example, the consumption current value acquisition portion 222 may acquire the consumption current value detected by the current detection portion 24 at the time of transmitting a short preamble portion of the RF signal from the transmission processing portion 221. Since the transmission processing portion 221 as well as the consumption current value acquisition portion 222 is included in the communication control portion 22, a time point of transmitting the short preamble portion of the RF signal can be grasped by the consumption current value acquisition portion 222.

The consumption current value acquisition portion 222 may sample the consumption current values detected by the current detection portion 24 at the respective time points corresponding to several points of a transmission packet of the RF signal transmitted from the transmission processing portion 221, and acquire an averaged consumption current value as the consumption current value of the transmission amplifier 12 (hereinafter, referred to as a modification 1).

Figure 5A:
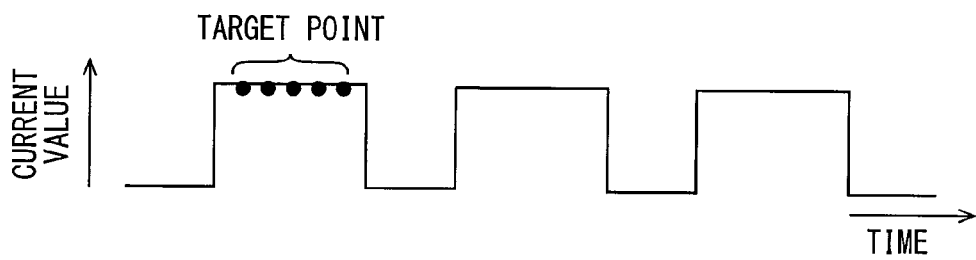
FIG. 5A is a schematic view illustrating one example of points at which a consumption current value is sampled.
Figure 5B:
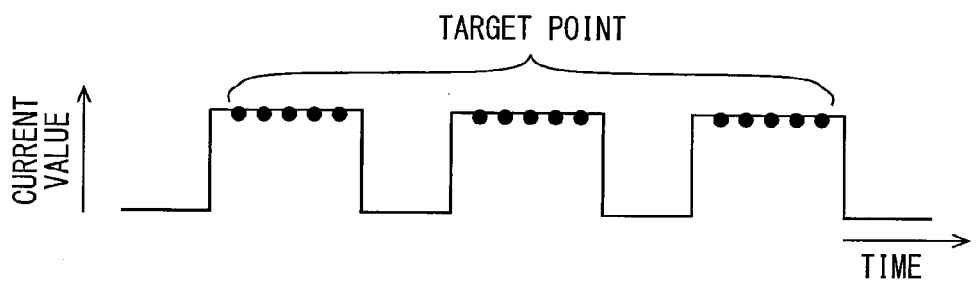
FIG. 5B is a schematic view illustrating another example of the points at which the consumption current value is sampled.
Figure 5C:
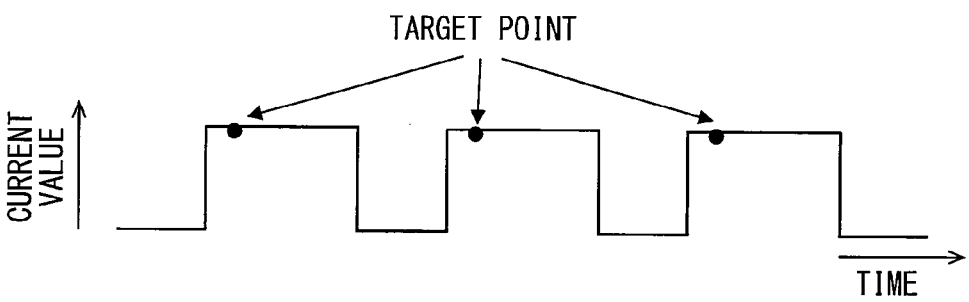
FIG. 5C is a schematic view illustrating another example of the points at which the consumption current value is sampled.

As the modification 1, as illustrated in FIG. 5A, the consumption current values detected by the current detection portion 24 may be sampled at the respective time points corresponding to the multiple points of one transmission packet of the RF signal, and then averaged. As illustrated in FIG. 5B, the consumption current values detected by the current detection portion 24 may be sampled at the respective time points corresponding to the multiple points of multiple transmission packets of the RF signal, and averaged. As illustrated in FIG. 5C, the consumption current values detected by the current detection portion 24 may be sampled at the respective time points corresponding to the same points of the respective multiple transmission packets of the RF signal, and averaged.

In S3, the amplifier output power calculation portion 223 calculates an output power value β of the transmission amplifier 12 with reference to the correspondence relationship table held in the memory 25 based on the consumption current value of the transmission amplifier 12 acquired by the consumption current value acquisition portion 222, and proceeds to S4.

For example, when the consumption current value of the transmission amplifier 12 which is acquired in the consumption current value acquisition portion 222 is 350 mA, the output power value β of the transmission amplifier 12 is calculated as 18 dBm with reference to the correspondence relationship table of FIG. 3. The reason the output power value β of the transmission amplifier 12 is 18 dBm despite the transmission power value α being 20 dBm is due to the cable transmission loss of the coaxial cable 3.

In S4, the parameter change portion 224 determines whether "the transmission power value α"–"the output power value β" falls within "a tolerance γ". When "the transmission power value α"–"the output power value β" falls within "the tolerance γ" (yes in S4), the processing returns to S2 and repeats the flow assuming that the transmission output of the antenna is maintained at the predetermined output. By contrast, when the transmission power value α–the output power value β does not fall within the tolerance γ (no in S4), the processing proceeds to S5 assuming that the transmission output of the antenna is not maintained at the predetermined output.

In S5, the parameter change portion 224 changes the setting of the transmission power value of the RF signal transmitted from the transmission processing portion 221 to a transmission power value α+(transmission power value α–output power value β), returns to S2, and repeats the flow. Hence, the parameter change portion 224 corresponds to a regulation portion in the present disclosure.

As an example, when the output power value β of the transmission amplifier 12 is 18 dBm despite the transmission power value α being 20 dBm, 2 dBm calculated by subtracting the output power value β from the transmission power value α is regarded as the cable transmission loss of the coaxial cable 3, and a change is made to transmit the RF signal from the transmission processing portion 221 with the transmission power value 22 dBm, taking the loss into account.

According to the configuration of the first embodiment, the consumption current value of the transmission amplifier 12 is detected from the power supplied to the transmission amplifier 12 from the power generation portion 21 by the current detection portion 24 of the wireless communication device 2. Since the correspondence relationship table is held in the memory 25 of the wireless communication device 2, the output power value of the transmission amplifier 12 is grasped with reference to the correspondence relationship table based on the consumption current value of the transmission amplifier 12 detected by the current detection portion 24.

Hence, even when a result obtained by detecting an output signal of the transmission amplifier 12 is not transmitted to the wireless communication device 2 from the antenna module 1, the output power value of the transmission amplifier 12 is grasped by the wireless communication device 2. Since the parameter change portion 224 adjusts the transmission signal generated by the transmission processing portion 221 so that the output power value is maintained at a desired (or predetermined) power value, even when the detector provided in the antenna module 1 and the dedicated vehicle harness for feeding back the detection result from the detector to the wireless communication device 2 are not mounted in the vehicle, the transmission output of the antenna 11 can be maintained at the predetermined output.

In addition, since the consumption current value acquisition portion 222 detects the actual consumption current value of the transmission amplifier 12, the amplifier output power calculation portion 223 calculates the output power value of the transmission amplifier 12, and the parameter change portion 224 regulates the transmission output of the antenna 11, various vehicles different in the length of the coaxial cable 3 can be accepted with the use of the single correspondence relationship table. Hence, there is no need to correct the transmission output of the antenna by the detector for each of the vehicles or for each of vehicle models.

As a result, in the in-vehicle communication apparatus 100 in which the antenna module 1 and the wireless communication device 2, which are physically separated from each other, are connected to each other through the coaxial cable 3, the transmission output of the antenna 11 can be maintained at the predetermined output while the costs such as the financial loss or the labor are suppressed.

Second Embodiment

The first embodiment of the present disclosure has been described. The present disclosure is not limited to the first embodiment, and a second embodiment described below also falls within the technical range of the present disclosure. Hereinafter, the following second embodiment will be described with reference to the drawings. For convenience of description, members having the same functions as those of the members illustrated in the drawings used for the description of the first embodiment described above are denoted by identical symbols, and their description will be omitted.

An in-vehicle communication apparatus 100 according to the second embodiment is identical with the in-vehicle communication apparatus 100 of the first embodiment except for taking a temperature into consideration. Specifically, the in-vehicle communication apparatus 100 according to the second embodiment is identical with the in-vehicle communication apparatus 100 of the first embodiment except that the wireless communication device 2 is equipped with a communication control portion 22a instead of the communication control portion 22, and a correspondence relationship table stored in a memory 25 is different from that in the first embodiment.

Figure 6:
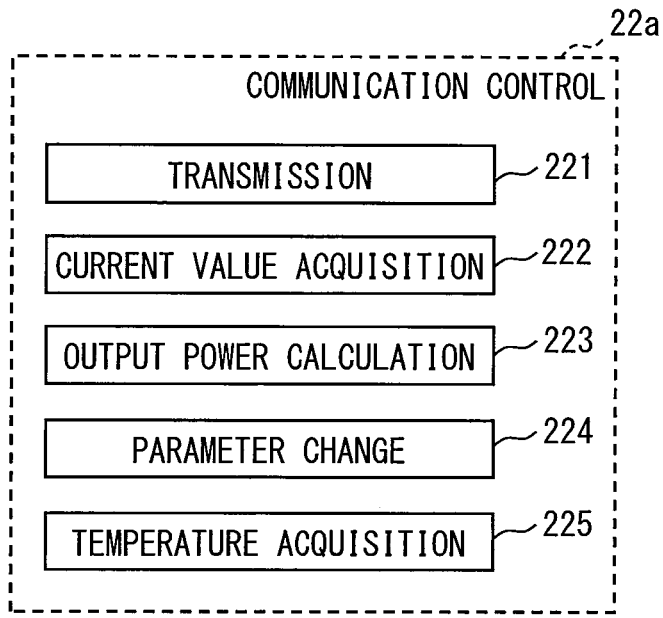
FIG. 6 is a block diagram illustrating an example of a schematic configuration of a communication control portion according to a second embodiment.

A schematic configuration of the communication control portion 22a will be described with reference to FIG. 6. As illustrated in FIG. 6, the communication control portion 22a includes, as functional blocks, a transmission processing portion 221, a consumption current value acquisition portion 222, an amplifier output power calculation portion 223, a parameter change portion 224, and a temperature acquisition portion 225.

The temperature acquisition portion 225 acquires a temperature detected by a temperature sensor such as a thermistor disposed in the vehicle except for an interior of the antenna module 1. As an example, a case in which an outside air temperature detected by a temperature sensor for detecting an outside air temperature of the vehicle is acquired through, for example, an in-vehicle LAN will be described below. The outside air temperature of the vehicle and the temperature within the antenna module 1 have a correspondence relationship, and since an ambient temperature of the transmission amplifier 12 within the antenna module 1 can be estimated from the outside air temperature, the outside air temperature is used.

The temperature acquired by the temperature acquisition portion 225 is not limited to the outside air temperature of the vehicle when the temperature is a temperature in a region except for the interior of the antenna module 1, from which the ambient temperature of the transmission amplifier can be estimated. As an example, when the wireless communication device 2 is disposed at a position where the temperature within the wireless communication device 2 and the temperature within the antenna module 1 have the correspondence relationship, a temperature within the wireless communication device 2 may be used. The temperature acquired by the temperature acquisition portion 225 corresponds to an estimation temperature in the present disclosure.

The memory 25 according to the second embodiment holds a table associating the consumption current value of the transmission amplifier 12 with the output power value of the transmission amplifier 12 (hereinafter, referred to as a temperature specific correspondence relationship table) for each of the outside air temperatures of the vehicle) in advance. The temperature specific correspondence relationship table corresponds to a temperature specific correspondence relationship in the present disclosure. Since the correspondence relationship is established between the outside air temperature of the vehicle and the ambient temperature of the transmission amplifier 12, the temperature specific correspondence relationship table may be regarded as a table representing the correspondence relationship between the consumption current value of the transmission amplifier 12 and the output power value of the transmission amplifier 12, which corresponds to the ambient temperature of the transmission amplifier 12.

The temperature specific correspondence relationship table may be obtained by, for example, performing measurement for each of the outside air temperatures of the vehicle in advance. The temperature specific correspondence relationship table may be provided in every predetermined temperature range such as 10° C. portion.

The amplifier output power calculation portion 223 according to the second embodiment calculates the output power value β of the transmission amplifier 12 with reference to the temperature specific correspondence relationship table held in the memory 25 based on the outside air temperature acquired in the temperature acquisition portion 225 and the consumption current value of the transmission amplifier 12 acquired by the consumption current value acquisition portion 222.

As an example, the temperature specific correspondence relationship table corresponding to the outside air temperature acquired by the temperature acquisition portion 225 is selected. The output power value β of the transmission amplifier 12 is calculated with reference to the selected temperature specific correspondence relationship table based on the consumption current value of the transmission amplifier 12 which is acquired in the consumption current value acquisition portion 222.

In the present example, the temperature specific correspondence relationship table that associates the consumption current value of the transmission amplifier 12 with the output power value of the transmission amplifier 12 for each of the temperatures is used. The present disclosure is not limited to this configuration. For example, the correspondence relationship table of the first embodiment and the correction values (hereinafter referred to as a temperature specific table correction values) of the correspondence relationship table for each of the temperatures may be used. The correspondence relationship table and the temperature specific table correction values also correspond to a temperature specific correspondence relationship in the present disclosure.

The correspondence relationship table and the temperature specific table correction values may be held in the memory 25 in advance. As an example, the temperature specific table correction values are correction values for the output power value β of the transmission amplifier 12 in the correspondence relationship table, which are provided in every predetermined temperature range such as 10° C. unit.

A process in the amplifier output power calculation portion 223 with the configuration using the correspondence relationship table and the temperature specific table correction values may be conducted as follows, for example. The temperature specific table correction value corresponding to the outside air temperature acquired in the temperature acquisition portion 225 is selected. The output power value β of the transmission amplifier 12 obtained with reference to the temperature specific correspondence relationship table based on the consumption current value of the transmission amplifier 12, which is acquired in the consumption current value acquisition portion 222, is corrected with the selected temperature specific table correction value.

The second embodiment has the same configuration as that in the first embodiment, and includes the configuration for taking the temperature into consideration. The second embodiment has the same effects as those in the first embodiment, and maintains the transmission output of the antenna 11 at the predetermined output according to the ambient temperature of the transmission amplifier 12.

Third Embodiment

The embodiments of the present disclosure have been described. The present disclosure is not limited to the embodiments, and a third embodiment described below falls within the technical range of the present disclosure. The third embodiment will be described with reference to the drawings. For convenience of description, members having the same functions as those of the members illustrated in the drawings used for the description of the first embodiment described above are denoted by identical symbols, and their description will be omitted.

An in-vehicle communication apparatus 100 according to the third embodiment is identical with the in-vehicle communication apparatus 100 of the first embodiment except for taking a duty ratio of the RF signal into consideration. Specifically, the in-vehicle communication apparatus 100 according to the third embodiment is identical with the in-vehicle communication apparatus 100 of the first embodiment except that the wireless communication device 2 is equipped with a communication control portion 22b instead of the communication control portion 22, and a correspondence relationship table stored in a memory 25 is different from that in the first embodiment.

Figure 7:
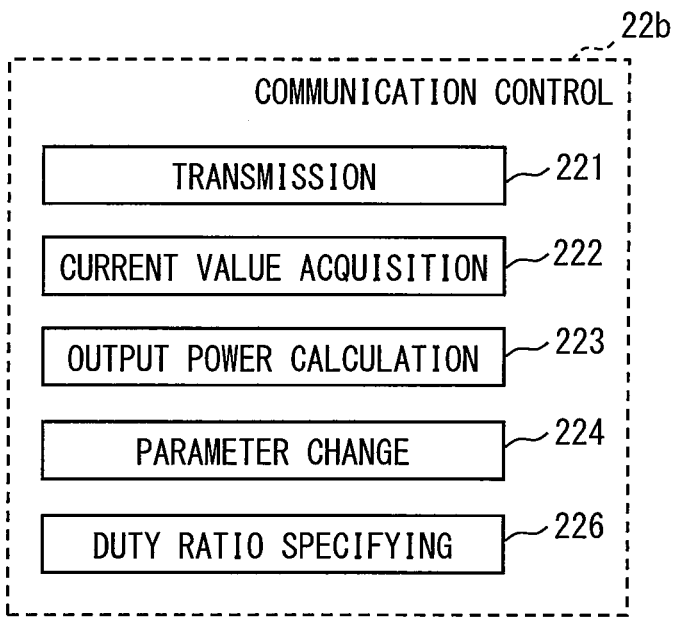
FIG. 7 is a block diagram illustrating an example of a schematic configuration of a communication control portion according to a third embodiment.

A schematic configuration of the communication control portion 22b will be described with reference to FIG. 7. As illustrated in FIG. 7, the communication control portion 22b includes, as functional blocks, a transmission processing portion 221, a consumption current value acquisition portion 222, an amplifier output power calculation portion 223, a parameter change portion 224, and a duty ratio specifying portion 226.

The duty ratio specifying portion 226 specifies a duty ratio of an RF signal transmitted from the transmission processing portion 221. Since the transmission processing portion 221 as well as the duty ratio specifying portion 226 is included in the communication control portion 22b, the duty ratio of the transmitted RF signal is grasped by the duty ratio specifying portion 226. The duty ratio is transmission time of RF signal/(transmission time of RF signal+non-transmission time of RF signal).

The memory 25 according to the third embodiment holds a table associating the consumption current value of the transmission amplifier 12 with the output power value of the transmission amplifier 12 (hereinafter referred to as a duty ratio specific correspondence relationship table) for each of the duty ratios of the RF signal in advance. The duty ratio specific correspondence relationship table corresponds to a duty ratio specific correspondence relationship in the present disclosure.

The duty ratio specific correspondence relationship table may be obtained by, for example, performing measurement in advance while the duty ratio of the transmitted RF signal is changed. The duty ratio specific correspondence relationship table may be provided in every predetermined numerical range of the duty ratio.

The amplifier output power calculation portion 223 of the third embodiment calculates an output power value β of the transmission amplifier 12 with reference to the duty ratio specific correspondence relationship table held in the memory 25 based on the duty ratio of the RF signal, which is specified by the duty ratio specifying portion 226, and the consumption current value of the transmission amplifier 12, which is acquired in the consumption current value acquisition portion 222.

As an example, the duty ratio specific correspondence relationship table corresponding to the duty ratio specified by the duty ratio specifying portion 226 is selected. The output power value β of the transmission amplifier 12 is calculated with reference to the selected duty ratio specific correspondence relationship table based on the consumption current value of the transmission amplifier 12, which is acquired in the consumption current value acquisition portion 222.

In this example, the duty ratio specific correspondence relationship table associates the consumption current value of the transmission amplifier 12 with the output power value of the transmission amplifier 12 for each of the duty ratios. The duty ratio specific correspondence relationship table is used. The present disclosure is not limited to this configuration. For example, the correspondence relationship table of the first embodiment and the correction values (hereinafter, referred to as a duty ratio specific table correction values) of the correspondence relationship table for each of the duty ratios may be used. The correspondence relationship table and the duty ratio specific table correction value also correspond to the duty ratio specific correspondence relationship in the present disclosure.

The correspondence relationship table and the duty ratio specific table correction values may be held in the memory 25 in advance. A process in the amplifier output power calculation portion 223 with the configuration using the correspondence relationship table and the duty ratio specific table correction values may be performed in the same manner as that in the case of using the temperature specific table correction values in the second embodiment.

The third embodiment has the same configuration as that in the first embodiment, and also includes the configuration for taking the duty ratio of the transmission signal into consideration. As a result, the third embodiment has the same effects as those in the first embodiment, and also can maintain the transmission output of the antenna 11 at the predetermined output according to the duty ratio of the transmission signal.

The present disclosure is not limited to the respective embodiments described above, and various changes are enabled within the scope described in the present disclosure, and an embodiment obtained by appropriately combining the technical methods disclosed in the different embodiments together is also included in the technical scope of the present disclosure. For example, the configuration of the second embodiment may be combined with the configuration of the third embodiment.

In an in-vehicle communication apparatus according to the present disclosure, an antenna module and a wireless communication device, which are physically separated from each other, are connected to each other through a coaxial cable. The antenna module includes an antenna and a transmission amplifier of the antenna. The wireless communication device includes a power generation portion that supplies a power for driving the antenna module, a signal generation portion that generates a transmission signal to be transmitted from the antenna, a power superimposition portion that superimposes the transmission signal generated by the signal generation portion on the power supplied from the power generation portion, and transmits the superimposed power to the transmission amplifier through the coaxial cable, a current detection portion that detects a consumption current value of the transmission amplifier from the power to be supplied from the power generation portion to the transmission amplifier, a correspondence relationship hold portion that holds a correspondence relationship between the consumption current value of the transmission amplifier and an output power value of the transmission amplifier in advance, and a regulation portion that regulates the transmission signal to be generated by the signal generation portion so that the output power value of the transmission amplifier which is obtained with reference to the correspondence relationship held in the correspondence relationship hold portion based on the consumption current value of the transmission amplifier which is detected by the current detection portion is maintained at a predetermined power value.

According to the in-vehicle communication apparatus of the present disclosure, since the power for driving the transmission amplifier is supplied from the power generation portion on the wireless communication device side, the consumption current value of the transmission amplifier can be detected by the current detection portion from the power supplied to the transmission amplifier from the power generation portion. Since the correspondence relationship between the consumption current value of the transmission amplifier and the output power value of the transmission amplifier is held in the correspondence relationship hold portion on the wireless communication device side, the output power value of the transmission amplifier can be grasped from the consumption current value of the transmission amplifier, which is detected by the current detection portion with reference to the correspondence relationship. Then, since the regulation portion regulates the transmission signal generated by the signal generation portion to maintain the output power value at the predetermined power value, the transmission output of the antenna can be maintained at the predetermined output even when the detector and the dedicated vehicle harness for feeding back the detection result from the detector to the wireless communication device are not mounted in the vehicle.

According to the in-vehicle communication apparatus of the present disclosure, the output power value of the transmission amplifier is grasped with the detection of the actual consumption current value of the transmission amplifier to regulate the transmission output of the antenna. Therefore, the in-vehicle communication apparatus according to the present disclosure can accept various vehicles different in the length of the coaxial cable with the use of the same correspondence relationship. Hence, there is no effort for using the detector for each of the vehicles or for each of the vehicle models.

As a result, in the in-vehicle communication apparatus in which the antenna module and the wireless communication device, which are physically separated from each other, are connected to each other through the coaxial cable, the transmission output of the antenna can be maintained at the predetermined output while the costs such as the financial loss or the labor are suppressed.

The portions in the present embodiment classify the interior of the communication control portions 22, 22a, and 22b for convenience paying attention to the functions of the communication control portions 22, 22a, and 22b, and do not mean that the interior of the communication control portions 22, 22a, and 22b is physically partitioned into portions corresponding to the respective portions. Therefore, the respective portions can be realized as a part of a computer program in the form of software, or can be realized by an IC chip or a large scaled integrated circuit in the form of hardware.

It is noted that a flowchart or the processing of the flowchart in the present application includes sections (also referred to as steps), each of which is represented, for instance, as S1. Further, each section can be divided into several sub-sections while several sections can be combined into a single section.

The embodiments and the configurations according to the present disclosure have been exemplified, but the embodiments and the configurations according to the present disclosure are not limited to the respective embodiments and the respective configurations described above. The embodiments and the configurations obtained by appropriately combining the respective technical elements disclosed in the different embodiments and configurations together also fall within the scope of the embodiments and the configurations according to the present disclosure.

What is claimed is:

1. An in-vehicle communication apparatus comprising:
   an antenna module; and
   a wireless communication device that is physically separated from the antenna module and connected to the antenna module through a coaxial cable,
   wherein:
   the antenna module includes
      an antenna, and
      a transmission amplifier of the antenna;
   the wireless communication device includes
      a power generation portion that supplies a power driving the antenna module,
      a signal generation portion that generates a transmission signal to be transmitted from the antenna,
      a power superimposition portion that superimposes the transmission signal generated by the signal generation portion on the power supplied from the power generation portion, and transmits a superimposed power to the transmission amplifier through the coaxial cable,
      a current detection portion that detects a consumption current value of the transmission amplifier from the power that is supplied from the power generation portion to the transmission amplifier,
      a correspondence relationship hold portion that holds a correspondence relationship between the consumption current value of the transmission amplifier and an output power value of the transmission amplifier in advance, and
      a regulation portion that adjusts the transmission signal generated by the signal generation portion to maintain the output power value of the transmission amplifier at a predetermined power value, the output power value being obtained with reference to the correspondence relationship held in the correspondence relationship hold portion based on the consumption current value of the transmission amplifier detected by the current detection portion.

2. The in-vehicle communication apparatus according to claim 1, wherein:
the wireless communication device further includes
a temperature acquisition portion that acquires an estimation temperature detected by a temperature sensor that detects the estimation temperature in a region except for an interior of the antenna module, the estimation temperature estimating an ambient temperature of the transmission amplifier;
the correspondence relationship hold portion holds a temperature specific correspondence relationship that is any one of
the correspondence relationship and a correction value of the correspondence relationship for the estimation temperature, and
the correspondence relationship for the estimation temperature in advance; and
the regulation portion adjusts the transmission signal generated by the signal generation portion to maintain the output power value of the transmission amplifier at a predetermined power value, the output power value being obtained with reference to the temperature specific correspondence relationship based on
the consumption current value of the transmission amplifier, which is detected by the current detection portion, and
the estimation temperature acquired by the temperature acquisition portion.

3. The in-vehicle communication apparatus according to claim 1, wherein:
the correspondence relationship hold portion holds a duty ratio specific correspondence relationship that is any one of
the correspondence relationship and a correction value of the correspondence relationship for each of duty ratios of the transmission signal, and
the correspondence relationship for each of the duty ratios in advance; and
the regulation portion adjusts the transmission signal generated by the signal generation portion to maintain the output power value of the transmission amplifier at a predetermined power value, the output power value being obtained with reference to the duty ratio specific correspondence relationship based on
the consumption current value of the transmission amplifier, which is detected by the current detection portion, and
the duty ratio of the transmission signal.

4. The in-vehicle communication apparatus according to claim 1, wherein:
the regulation portion refers, as the consumption current value of the transmission amplifier, the consumption current value detected by the current detection portion at a time point of transmitting a short preamble portion of the transmission signal from the signal generation portion.

5. The in-vehicle communication apparatus according to claim 1, wherein:
the regulation portion refers, as the consumption current value of the transmission amplifier, an average of the consumption current value detected by the current detection portion at respective time points corresponding to a plurality of points of a transmission packet of the transmission signal transmitted from the signal generation portion.

6. The in-vehicle communication apparatus according to claim 5, wherein:
the regulation portion refers, as the consumption current value of the transmission amplifier, an average of the consumption current value detected by the current detection portion at respective time points corresponding to a plurality of points of one transmission packet of the transmission signal transmitted from the signal generation portion.

7. The in-vehicle communication apparatus according to claim 5, wherein:
the regulation portion refers, as the consumption current value of the transmission amplifier, an average of the consumption current value detected by the current detection portion at respective time points corresponding to a plurality of points of a plurality of transmission packets of the transmission signal transmitted from the signal generation portion.

8. The in-vehicle communication apparatus according to claim 7, wherein:
the regulation portion refers, as the consumption current value of the transmission amplifier, an average of the consumption current value detected by the current detection portion at respective time points corresponding to an identical point of each of a plurality of transmission packets of the transmission signal transmitted from the signal generation portion.

* * * * *